United States Patent
Flemming et al.

(10) Patent No.: US 11,962,057 B2
(45) Date of Patent: Apr. 16, 2024

(54) GLASS BASED EMPTY SUBSTRATE INTEGRATED WAVEGUIDE DEVICES

(71) Applicant: 3D Glass Solutions, Inc., Albuquerque, NM (US)

(72) Inventors: Jeb H. Flemming, Albuquerque, NM (US); Roger Cook, Albuquerque, NM (US); Kyle McWethy, Albuquerque, NM (US)

(73) Assignee: 3D GLASS SOLUTIONS, INC., Albuquerque, NM (US)

( * ) Notice: Subject to any disclaimer, the term of this patent is extended or adjusted under 35 U.S.C. 154(b) by 355 days.

(21) Appl. No.: 17/598,009

(22) PCT Filed: Apr. 3, 2020

(86) PCT No.: PCT/US2020/026673
§ 371 (c)(1),
(2) Date: Sep. 24, 2021

(87) PCT Pub. No.: WO2020/206323
PCT Pub. Date: Oct. 8, 2020

(65) Prior Publication Data
US 2022/0173488 A1 Jun. 2, 2022

Related U.S. Application Data

(60) Provisional application No. 62/829,882, filed on Apr. 5, 2019.

(51) Int. Cl.
*H01P 3/12* (2006.01)
*C03C 3/095* (2006.01)
(Continued)

(52) U.S. Cl.
CPC .............. *H01P 3/121* (2013.01); *C03C 3/095* (2013.01); *C03C 14/006* (2013.01); *H01L 23/66* (2013.01);
(Continued)

(58) Field of Classification Search
CPC ........ H01P 3/121; H01P 11/002; H01P 5/107; H01P 3/12; H01P 11/001; H01P 3/003;
(Continued)

(56) References Cited

U.S. PATENT DOCUMENTS

| 2,515,937 A | 12/1943 | Stookey |
| 2,515,943 A | 1/1949 | Stookey |

(Continued)

FOREIGN PATENT DOCUMENTS

| CN | 1562831 A | 4/2004 |
| CN | 105047558 A | 11/2015 |

(Continued)

OTHER PUBLICATIONS

Grine et al., High-Q Substrate Integrated Waveguide Resonator Filter With Dielectric Loading, Jul. 24, 2017, IEEE vol. 5 2017, pp. 12526-12532 (Year: 2017).*

(Continued)

*Primary Examiner* — John W Poos
(74) *Attorney, Agent, or Firm* — Edwin S. Flores; Daniel J. Chalker; Chalker Flores, LLP

(57) ABSTRACT

The present invention includes a method of creating high Q empty substrate integrated waveguide devices and/or system with low loss, mechanically and thermally stabilized in photodefinable glass ceramic substrate. The photodefinable glass ceramic process enables high performance, high quality, and/or low-cost structures. Compact low loss RF empty (Continued)

substrate integrated waveguide devices are a cornerstone technological requirement for RF systems, in particular, for portable systems.

10 Claims, 3 Drawing Sheets

(51) Int. Cl.
  *C03C 14/00*  (2006.01)
  *H01L 23/66*  (2006.01)
  *H01P 11/00*  (2006.01)

(52) U.S. Cl.
  CPC .... *H01P 11/002* (2013.01); *H01L 2223/6627* (2013.01)

(58) Field of Classification Search
  CPC ....... H01P 5/028; C03C 3/095; C03C 14/006; C03C 15/00; C03C 4/04; C03C 17/40; C03C 2214/08; C03C 2218/115; C03C 2218/34; C03C 2214/05; C03C 2218/154; C03C 2218/33; C03C 10/00; C03C 17/06; C03C 10/0009; C03C 14/004; C03C 17/10; C03C 23/0005; C03C 17/002; C03C 17/22; C03C 2217/253; C03C 2217/732; C03C 3/091; C03C 3/105; C03C 23/007; H01L 23/66; H01L 2223/6627; H01L 23/15; H01L 23/64; H03H 7/38; H03H 2007/013; H03H 7/0161
  See application file for complete search history.

(56) References Cited

U.S. PATENT DOCUMENTS

| | | |
|---|---|---|
| 2,515,940 A | 7/1950 | Stookey |
| 2,515,941 A | 7/1950 | Stookey |
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,292,115 A | 12/1966 | La Rosa |
| 3,904,991 A | 9/1975 | Ishli et al. |
| 3,985,531 A | 10/1976 | Grossman |
| 3,993,401 A | 12/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borrelli et al. |
| 4,537,612 A | 8/1985 | Borrelli et al. |
| 4,611,882 A | 9/1986 | Susumu |
| 4,647,950 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,312,674 A | 5/1994 | Heartling et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,046,641 A | 4/2000 | Chawla et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,417,754 B1 | 7/2002 | Bernhardt et al. |
| 6,485,690 B1 | 11/2002 | Pfost et al. |
| 6,495,411 B1 | 12/2002 | Mei |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,771,860 B2 | 8/2004 | Trezza et al. |
| 6,783,920 B2 | 8/2004 | Livingston et al. |
| 6,824,974 B2 | 11/2004 | Pisharody et al. |
| 6,830,221 B1 | 12/2004 | Janson et al. |
| 6,843,902 B1 | 1/2005 | Penner et al. |
| 6,875,544 B1 | 4/2005 | Sweatt et al. |
| 6,932,933 B2 | 8/2005 | Helvajian et al. |
| 6,977,722 B2 | 12/2005 | Wohlstadter et al. |
| 7,033,821 B2 | 4/2006 | Kim et al. |
| 7,064,045 B2 | 6/2006 | Yang |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnworth et al. |
| 7,915,076 B2 | 3/2011 | Ogawa et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 * | 4/2014 | Flemming ................ C03C 4/04 430/311 |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 9,843,083 B2 * | 12/2017 | Cooper ................ H01P 1/213 |
| 10,070,533 B2 | 9/2018 | Flemming et al. |
| 10,201,901 B2 | 2/2019 | Flemming et al. |
| 11,524,807 B2 | 12/2022 | Gentili et al. |
| 11,527,807 B2 * | 12/2022 | Gentili ................ H05K 1/0243 |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0107459 A1 | 6/2003 | Takahashi et al. |
| 2003/0124716 A1 | 7/2003 | Hess et al. |
| 2003/0135201 A1 | 7/2003 | Gonnelli |
| 2003/0143802 A1 | 7/2003 | Chen et al. |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0058504 A1 | 3/2004 | Kellar et al. |
| 2004/0104449 A1 | 6/2004 | Yoon |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |

(56) References Cited

U.S. PATENT DOCUMENTS

| | | |
|---|---|---|
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0111162 A1 | 5/2005 | Osaka et al. |
| 2005/0118779 A1 | 6/2005 | Ahn |
| 2005/0150683 A1 | 7/2005 | Farnworth et al. |
| 2005/0170670 A1 | 8/2005 | King et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0023386 A1 | 2/2007 | Kravitz et al. |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0042785 A1 | 2/2008 | Yagisawa |
| 2008/0079565 A1 | 4/2008 | Koyama |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamurar |
| 2008/0231402 A1 | 9/2008 | Jow et al. |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0200540 A1 | 8/2009 | Bjoerk et al. |
| 2009/0243783 A1 | 10/2009 | Fouquet et al. |
| 2009/0290281 A1 | 11/2009 | Nagamoto et al. |
| 2010/0009838 A1 | 1/2010 | Muraki |
| 2010/0022416 A1 | 1/2010 | Flemming et al. |
| 2010/0044089 A1 | 2/2010 | Shibuya et al. |
| 2010/0059265 A1 | 3/2010 | Kim |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0084371 A1 | 4/2011 | Rotay et al. |
| 2011/0086606 A1 | 4/2011 | Chen et al. |
| 2011/0108525 A1 | 5/2011 | Chien et al. |
| 2011/0114496 A1 | 5/2011 | Dopp et al. |
| 2011/0115051 A1 | 5/2011 | Kim et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0015578 A1 | 1/2013 | Thacker et al. |
| 2013/0105941 A1 | 5/2013 | Vanslette et al. |
| 2013/0119401 A1 | 5/2013 | D'evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy |
| 2014/0070380 A1 | 3/2014 | Chiu et al. |
| 2014/0104284 A1 | 4/2014 | Shenoy et al. |
| 2014/0104288 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Kim et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0228712 A1 | 8/2015 | Yun |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1 | 6/2016 | Fushie |
| 2016/0181211 A1 | 6/2016 | Kamagin et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0213762 A1 | 4/2017 | Flemming et al. |
| 2017/0370870 A1 | 12/2017 | Fomina et al. |
| 2018/0310399 A1 | 10/2018 | Nair et al. |
| 2018/0315811 A1 | 11/2018 | Cho et al. |
| 2018/0323485 A1 | 11/2018 | Gnanou et al. |
| 2019/0280079 A1 | 7/2019 | Bouvier et al. |
| 2020/0060513 A1 | 2/2020 | Ito et al. |
| 2020/0066443 A1 | 2/2020 | Lu et al. |
| 2020/0119255 A1 | 4/2020 | Then et al. |
| 2020/0168536 A1 | 5/2020 | Link et al. |
| 2020/0211985 A1 | 7/2020 | Pietambaram et al. |
| 2020/0227470 A1 | 7/2020 | Then et al. |
| 2020/0235020 A1 | 7/2020 | Boek |
| 2020/0252074 A1 | 8/2020 | Healy et al. |
| 2020/0275558 A1 | 8/2020 | Fujita |
| 2021/0013303 A1 | 1/2021 | Chen et al. |
| 2021/0271275 A1 | 9/2021 | Kim et al. |

FOREIGN PATENT DOCUMENTS

| | | |
|---|---|---|
| CN | 105938928 | 9/2016 |
| CN | 210668058 U | 6/2020 |
| DE | 102004059252 A1 | 1/2006 |
| EP | 0311274 A2 | 12/1989 |
| EP | 0507719 A1 | 10/1992 |
| EP | 0685857 B1 | 12/1995 |
| EP | 0949648 A1 | 10/1999 |
| EP | 1487019 A1 | 12/2004 |
| EP | 1683571 A1 | 6/2006 |
| GB | 619779 A | 3/1949 |
| GB | 1407151 | 9/1975 |
| JP | 56-155587 | 12/1981 |
| JP | 61149905 | 7/1986 |
| JP | 61231529 A | 10/1986 |
| JP | 62202840 | 9/1987 |
| JP | 63-128699 A | 6/1988 |
| JP | H393683 A | 4/1991 |
| JP | 05139787 A | 6/1993 |
| JP | 08179155 | 12/1994 |
| JP | 08026767 | 1/1996 |
| JP | H10007435 A | 1/1998 |

(56) References Cited

FOREIGN PATENT DOCUMENTS

| | | | |
|---|---|---|---|
| JP | 10199728 A | 7/1998 | |
| JP | 11344648 A | 12/1999 | |
| JP | 2000228615 A | 8/2000 | |
| JP | 2001033664 A | 2/2001 | |
| JP | 2005302987 A | 10/2005 | |
| JP | 2005215644 | 11/2005 | |
| JP | 2006032982 A | 2/2006 | |
| JP | 2006179564 A | 6/2006 | |
| JP | 2006324489 A | 11/2006 | |
| JP | 2008252797 A | 10/2008 | |
| JP | 2011192836 A | 9/2011 | |
| JP | 2012079960 A | 4/2012 | |
| JP | 2013062473 A | 4/2013 | |
| JP | 2013217989 A | 10/2013 | |
| JP | 2014241365 A | 12/2014 | |
| JP | 2015028651 A | 2/2015 | |
| JP | H08026767 A | 1/2016 | |
| JP | 2018200912 A | 12/2018 | |
| JP | 2021145131 A | 9/2021 | |
| KR | 1020040001906 B1 | 1/2004 | |
| KR | 1020050000923 | 1/2005 | |
| KR | 20060092643 A | 8/2006 | |
| KR | 100941691 A | 2/2010 | |
| KR | 101167691 B1 | 7/2012 | |
| KR | 101519760 | 5/2015 | |
| WO | 2007088058 A1 | 8/2007 | |
| WO | 2008119080 A1 | 10/2008 | |
| WO | 2008154931 A1 | 12/2008 | |
| WO | 2009029733 A2 | 3/2009 | |
| WO | 2009062011 A1 | 5/2009 | |
| WO | 2009126649 A2 | 10/2009 | |
| WO | 2010011939 A2 | 1/2010 | |
| WO | 2011100445 A1 | 8/2011 | |
| WO | 2011109648 A1 | 9/2011 | |
| WO | 2012078213 A1 | 6/2012 | |
| WO | 2014043267 A1 | 3/2014 | |
| WO | 2014062226 A1 | 4/2014 | |
| WO | 2014062311 A2 | 4/2014 | |
| WO | 2014193525 A1 | 12/2014 | |
| WO | 2015108648 A1 | 7/2015 | |

OTHER PUBLICATIONS

European Search Report and Supplemental European Search Report for EP 19861556.9 dated Jan. 18, 2022, 9 pp.
European Search Report and Supplemental European Search Report for EP 19905255.6 dated Jul. 26, 2022, 8 pp.
Supplementary European Search Repor for EP 21768296.2 dated May 5, 2023, 10 pp.
European Search Report and Supplemental European Search Report for EP 21787618.4 dated Jul. 28, 2023, 10 pp.
International Search Report and Written Opinion for PCT/US2023/064364 dated Sep. 27, 2023, by USPTO 11 ps.
International Search Report and Written Opinion for PCT/US2023/17311 dated Aug. 14, 2023 by the USPTO, 16 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
International Search Report and Written Opinion for PCT/US2020/026673 dated Jun. 22, 2020, by the USPTO, 13 pp.
International Search Report and Written Opinion for PCT/US2020/28474 dated Jul. 17, 2020 by the USPTO, 7 pp.
International Search Report and Written Opinion for PCT/US2020/54394 dated Jan. 7, 2021 by the USPTO, 15 pp.
International Search Report and Written Opinion for PCT/US2021/21371 dated May 20, 2021 by the USPTO, 10 pp.
International Search Report and Written Opinion for PCT/US2021/27499 dated Jun. 16, 2021 by the USPTO, 7 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #205, Bangs Laboratories, www.bangslabs.com/technotes/205.pdf, "Covalent Coupling".
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
Topper, et al., "Development of a high density glass interposer based on wafer level packaging technologies," 2014 IEEE 64th Electronic Components and Technology Conference, May 27, 2014, pp. 1498-1503.
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
International Search Report and Written Opinion for PCT/US2022/42516 dated Feb. 3, 2023 by the USPTO, 22 pp.

(56) References Cited

OTHER PUBLICATIONS

International Search Report and Written Opinion for PCT/US2023/010118 dated Apr. 5, 2023 by the USPTO, 12 pp.
Aslan, et al, "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17757365.6 dated Oct. 14, 2019, 14 pp.
Extended European Search Report 17744848.7 dated Oct. 30, 2019, 9 pp.
European Search Report and Supplemental European Search Report for EP 18828907 dated Mar. 25, 2020, 11 pp.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
Geddes, et al, "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
Extended European Search Report for EP 19906040.1 dated Feb. 4, 2022, 16 pp.
European Search Report and Supplemental European Search Report for EP 19905255.6 dated Aug. 4, 2022, 8 pp.
European Search Report and Supplemental European Search Report for EP 20783596.8 dated Oct. 26, 2022, 13 pp.
European Search Report and Supplemental European Search Report for EP 20877664.1 dated Oct. 28, 2022, 10 pp.
Flemming, J.H., et al., "Cost Effective 3D Glass Microfabrication for Advanced RF Packages," Microwave Journal, Apr. 14, 2014, 12 pp.
Foster, T., "High-Q RF Devices in APEX Glass," Jun. 21, 2018, https://nanopdf.com/download/high-q-rf-devices-in-apex-glass_pdf, retrieved on Oct. 3, 2022, 8 pp.
International Search Report and Written Opinion for PCT/US2022/31993 dated Sep. 9, 2022 by the USPTO, 9 pp.
International Search Report and Written Opinion for PCT/US2022/29442 dated Oct. 6, 2022 by the USPTO, 20 pp.
Extended European Search Report for EP 20792242.8 dated May 3, 2022, 10 pp.
Kim, Dongsu, et al., "A Compact and Low-profile GaN Power Amplifier Using Interposer-based MMCI Technology," 2014 IEEE 16th Electronics Packaging Technology Conference, pp. 672-675.
Optics 101, "What is a Halogen Lamp?", Apr. 25, 2014, p. 1-2.

* cited by examiner

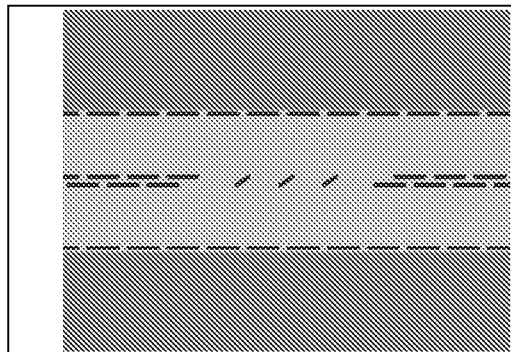 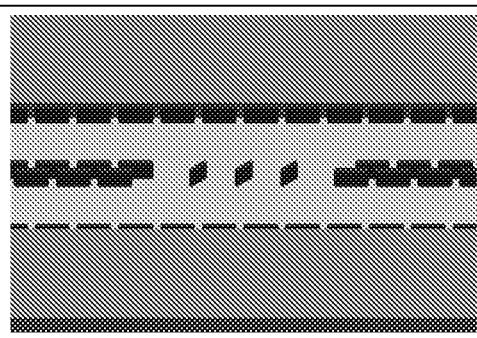
FIG. 5A　　　　　　　　　　FIG. 5B
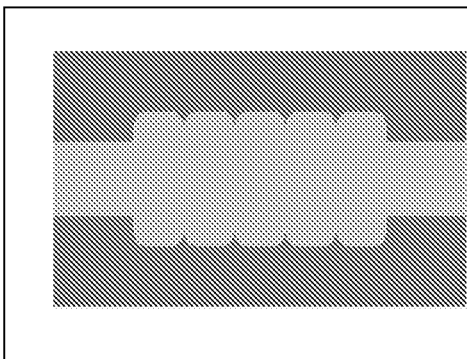 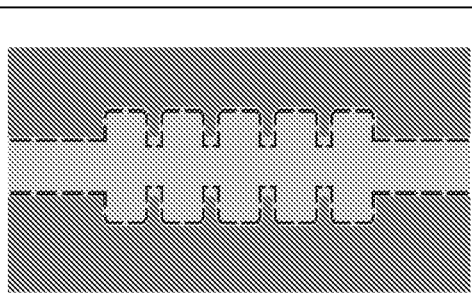
FIG. 6A　　　　　　　　　　FIG. 6B
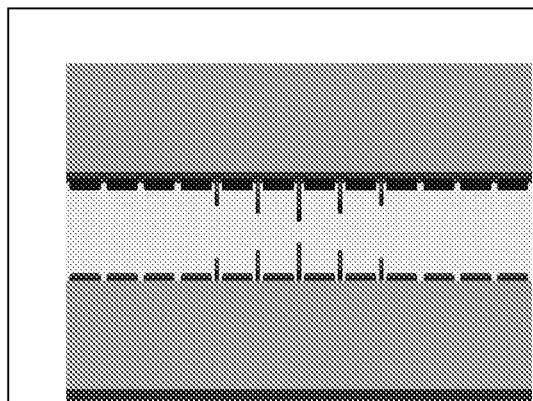 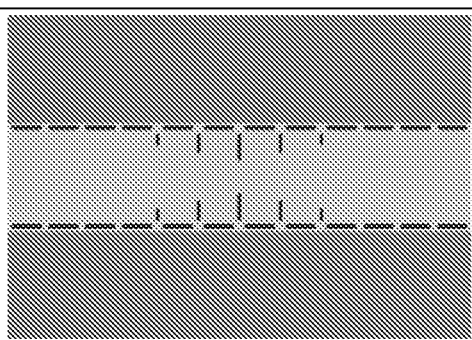
FIG. 7A　　　　　　　　　　FIG. 7B

GLASS BASED EMPTY SUBSTRATE INTEGRATED WAVEGUIDE DEVICES

CROSS-REFERENCE TO RELATED APPLICATIONS

This application is the National Stage of International Application No. PCT/US2020/026673, filed on 3 Apr. 2020 claiming the priority to U.S. Provisional Application No. 62/829,882 filed on 5 Apr. 2019, the contents of each of which are incorporated by reference herein.

TECHNICAL FIELD OF THE INVENTION

The present invention relates in general to the field of glass based empty substrate integrated waveguide devices. More particularly, the present invention relates to the reduction of parasitic capacitance from fringe capacitance in an RF capacitive resonate filter on the same substrate or in a package.

STATEMENT OF FEDERALLY FUNDED RESEARCH

None.

BACKGROUND OF THE INVENTION

Without limiting the scope of the invention, its background is described in connection with reduction of parasitic capacitance from fringe capacitance.

The tradeoffs with any transmission media line starts with its attenuation characteristics. Traditional Empty waveguide (EW) devices have been used in many applications, however, these have a significant number of advantages and disadvantages relative to other traditional waveguide devices. FIG. 1 shows an image of a traditional waveguide device 10 of the prior art.

Several advancements have been made including empty substrate integrate waveguide (ESIW) devices, such as those developed by Belenguer, et al. A. Belenguer, H. Esteban, and V. E. Boria, "Novel empty substrate integrated waveguide for high-performance microwave integrated circuits," IEEE Trans. Microw. Theory Techn., vol. 62, no. 4, pp. 832-839, 2014, and B. A. Belenguer, J. L. Cano, H. Esteban, E. Artal, and V. E. Boria, "Empty substrate integrated waveguide technology for E plane high-frequency and high-performance circuits," Radio Sci., vol. 52, no. 1, pp. 49-69, 2017. The initial efforts show the ESIW using the substrate to support the bottom of the ESIW. Other versions used a metal plate on the printed circuit board (PCB) as the bottom of the ESIW, which eliminates substrate losses from sitting on top of, or as a part of, the PCB substrate. The metal plate on PCB design eliminated or substantially reduced the dielectric loss associated with the substrate, but it introduced additional losses associated with surface roughness and the mechanical distortion of the PCB substrate. Generally, the surface roughness losses are less than the dielectric losses, however, the PCB mechanical from the distortion can be large enough to make the ESIW device completely non-functional. FIG. 2 shows the dimension definition of rectangular substrate integrated 20 of the prior art.

The advantages of traditional ESIW devices include: (1) less metal it used that carries the signal, which is far greater than it would be in microstrip or stripline device; (2) they can be manufactured at a low cost and easy to manufacture using a standard printed circuit board (PCB) substrate; (3) lower transmission losses and higher Q resonators and filters than other planar transmission lines; (4) lower cut-off frequency than traditional waveguide; and (5) higher peak power handling capability. However, these advantages of traditional ESIW devices bring with them certain significant disadvantages, including: (1) leakage losses, which are substantial, based how tight the vias are spaced; (2) dielectric losses of the filled or partially filled guided structure that contributes to the overall dielectric losses (loss tangent) of the substrate integrate waveguide (SIW) device, as a result, dielectric filled SIW are not considered applicable for millimeter-wave frequencies; (3) losses due to conductivity of a free-standing metal substrate are close to zero if a smooth substrate is selected that does not distort over time; (4) ESIWs have a larger footprint compared to the dielectric filled SIWs; and (5) the roughness of the outer face of the copper foil top and bottom of the ESIW device. The roughness of the copper foil/plate (0.3 µm on Rogers 5880 substrate) and on the inner face (0.4 µm), which roughness contributes to the RF losses.

ESIW can be thought of as a dielectric filled waveguide (DFW) where the dielectric constant is 1 and the loss tangent is zero. For $TE_{10}$ mode, the dimension "b" is not important, as it does not affect the cut off frequency of the waveguide. The substrate can be at any thickness; it only affects the dielectric loss (thicker=lower loss). For a rectangular empty substrate integrated waveguide, cut off frequency of arbitrary mode is found by the following formula:

Empty Substrate Integrated Waveguide are guided by the following formula:

$$f_c = \frac{c}{2\pi} \sqrt{\left(\frac{m\pi}{a}\right)^2 + \left(\frac{n\pi}{b}\right)^2},$$

where: c is the speed of light, and m, n are mode numbers, a, b: are the vertical and horizontal dimensions of the waveguide.

Published literature on ESIW design requires the following two conditions to be met.

$$\lambda_{guide} = \frac{\lambda_{Free\ space}}{\sqrt{1 - \left(\frac{\lambda_{Free\ space}}{\lambda_{cutoff}}\right)^2}}$$

$$\lambda_{guide} = \frac{c}{f} \times \frac{1}{\sqrt{1 - \left(\frac{c}{2a \cdot f}\right)^2}}$$

A dielectricless SIW (DSIW) or Empty SIW was first presented in 2016. In this design of the prior art, a thick substrate was milled, metallized, and then covered with a top metallic cover stuck with a prepreg layer (preimpregnated composite fibers, where a thermoset polymer matrix material, such as epoxy, is present), so that it is almost dielectric-free.

The earliest ESIW was proposed by Belenguer in which they removed part of the dielectric body in the substrate to reduce the power dissipated in the dielectric. The emptied substrate had to be closed with top and bottom conducting layers. These layers could be simple, low-cost FR4 substrates, and the authors proposed to affix the layers to the central substrate using a prepreg PCB. The via holes forming the walls of the waveguide could be of any of the plated-through, buried, or blind types. The vias and lateral walls would be metallized using a standard procedure of PCB. As a result, the lateral walls of the waveguide are formed. The waveguide is closed by attaching two metallic covers to the main PCB substrate. One of the covers acts as the upper waveguide wall while the other becomes the lower face of the waveguide 30 (see Prior Art FIG. 3). The electrical connection among these different layers must be of very high quality, otherwise, the device will not function adequately. This high-quality interlayer connection is achieved by means of soldering. A tin soldering paste was used to solder the different layers. This soldering paste is distributed on the top and bottom of the main layer. The structure is assembled, and, finally, the solder paste is dried in a reflow oven.

However, despite these improvements, a need remains for a low loss RF ESIW structure that can be manufactured using commonly available equipment and methods, without the significant disadvantages of current ESIWs.

SUMMARY OF THE INVENTION

In one embodiment, the present invention includes a method of making an empty substrate integrated waveguide (ESIW) device including antenna and RF signal launch elements comprising, consisting essentially of, or consisting of, the steps of: forming an ESIW pattern, an ESIW supports RF signal launch, a perimeter ground patterns and one or more edges of a waveguide on a wafer comprising lithium ions; annealing the exposed pattern in the presence of silver ions at a temperature that enables silver ions to coalesce into silver nanoparticles, and increasing the temperature to between 520° C.-620° C. to allow lithium oxide to form around the silver nanoparticles; coating a topside of the wafer with a photoresist; exposing and developing a pattern to protect the waveguide pattern while leaving the ground pattern exposed; spinning on a blanket photoresist on a backside of the wafer and etching exposed ground ceramic portions in an HF bath; removing the photoresist leaving one or more ground pattern openings and a ceramic waveguide; electroplating copper on the open ground pattern until all ground openings are filled; coating a backside of the wafer with photoresist; exposing and developing a rectangular element with one or more small etch release features; depositing 200 Å to 2,000 Å of titanium metal to form a first titanium layer, followed by a 1 μm deposition of copper onto the backside of the wafer; removing the photoresist leaving a rectangular copper element to form a bottom of the ESIW structure that is electrically connected to the ground pattern copper and waveguide launching element; exposing and developing a rectangular element in photoresist that is oversized over the ceramic ESIW pattern with the one or more etch release features; electroplating copper on the exposed copper areas with between 5-50 μm of copper to improve the rigidity of the ESIW structure; depositing 200 Å to 2,000 Å of titanium metal to form a second titanium layer followed by a 0.5 um to 1 μm deposition of copper onto the topside of the wafer; coating the top side of the wafer with a photoresist; exposing and developing a top side ESIW pattern; using a standard photoresist stripper, copper etchant and titanium etchant to remove the photoresist and to etch any exposed deposition metal, leaving the electroplated copper ESIW patterns; placing wafer is a 0.5% to 50% HF ultrasonic bath; and washing the wafer to remove the HF to obtain the empty substrate integrated waveguide device including antenna and RF signal launch elements. In one aspect, the ESIW has a Q greater than 40. In another aspect, the ESIW has a lower cut-off frequency than a printed circuit board waveguide device at the same frequency. In another aspect, the ESIW has a higher peak power handling capability than a printed circuit board waveguide device at the same frequency. In another aspect, the first, the second, or both first and second titanium layers have a thickness of 300 Å.

In another embodiment, the present invention includes a method of creating a empty substrate integrated waveguide system including at least one or more of a phase matching, time delay, crossover or filter elements, connected to an antenna and RF signal launch element, comprising, consisting essentially of, or consisting of: exposing to an ESIW pattern, an ESIW support, RF signal launch, perimeter ground patterns, and the edges of a waveguide; annealing the exposed pattern temperature enabling the coalesces silver ions into silver nanoparticles; annealing the exposed pattern temperature range heated between 520° C.-620° C. for allowing the lithium oxide to form around the silver nanoparticles; coating a topside of the wafer with a photoresist and exposing and developing a pattern to protect the waveguide pattern while leaving the ground pattern exposed; spinning on blanket photoresist on to the backside of the wafer and HF bath to etch the exposed ground ceramic portions; removing the photoresist to leave ground pattern openings and ceramic waveguide; electroplating copper on the open ground pattern until all ground openings are filled; coating a backside of the wafer with photoresist; and exposing and developing a rectangular element with one or more small etch release features; depositing 200 Å to 2,000 Å of titanium metal to form a first titanium layer followed by a 1 μm deposition of copper onto the backside of the wafer; removing the photoresist to leave a rectangular copper element for the bottom of the ESIW structure that is electrically connected to the ground pattern copper and waveguide launching element; exposing and developing a rectangular element in photoresist that is oversized of the ceramic ESIW pattern with one or more etch release features; electroplating copper on the exposed copper areas with between 5-50 um of copper in order to improve the rigidity of the ESIW structure; depositing 200 Å to 2,000 Å of titanium metal to form a second titanium layer followed by a 0.5 um to 1 μm deposition of copper onto the topside of the wafer; coating the top side of the wafer with photoresist; exposing and developing a top side ESIW pattern and patterns for the RF signal launch elements and the antenna elements, and at least one the Phase matching elements, the time delay elements, or the filter elements and; using a standard photoresist stripper, copper etchant and titanium etchant to remove the photoresist and to etch any exposed deposition metal, leaving an electroplated copper ESIW patterns; placing the wafer into a 0.5% to 50% HF in an ultrasonic bath; and washing the wafer to remove the HF. In another aspect, the ESIW has a Q greater than 20, 30, 35, 36, 37, 38, 39, or 40. In another aspect, the ESIW has a Lower cut-off frequency than a printed circuit board waveguide device at the same frequency. In another aspect, the ESIW has higher peak power handling capability than an ESIW. In another aspect, the first, the second, or both first and second titanium layers have a thickness of 300 Å.

In one embodiment, the present invention includes a high Q empty substrate integrated waveguide devices and/or system with low loss, mechanically and thermally stabilized in a photodefinable glass ceramic substrate. In one aspect, the ESIW has a Q greater than 20, 30, 35, 36, 37, 38, 39, or 40. In another aspect, the ESIW has a lower cut-off frequency than a printed circuit board waveguide device at the same frequency. In another aspect, the ESIW has a higher peak power handling capability than a printed circuit ESIW.

BRIEF DESCRIPTION OF THE DRAWINGS

For a more complete understanding of the features and advantages of the present invention, reference is now made to the detailed description of the invention along with the accompanying figures and in which:

FIG. 5A shows top view, and FIG. 5B an oblique view, of a RF filter that can be a part of the ESIW system of the present invention.

FIG. 6A shows a top view, and FIG. 6B shows an oblique view, of a cavity RF filter that can be a part of the ESIW system of the present invention.

FIG. 7A shows a top view, and FIG. 7B an oblique view, of a RF filter coupler that can be a part of the ESIW system of the present invention.

DETAILED DESCRIPTION OF THE INVENTION

Figure 1:
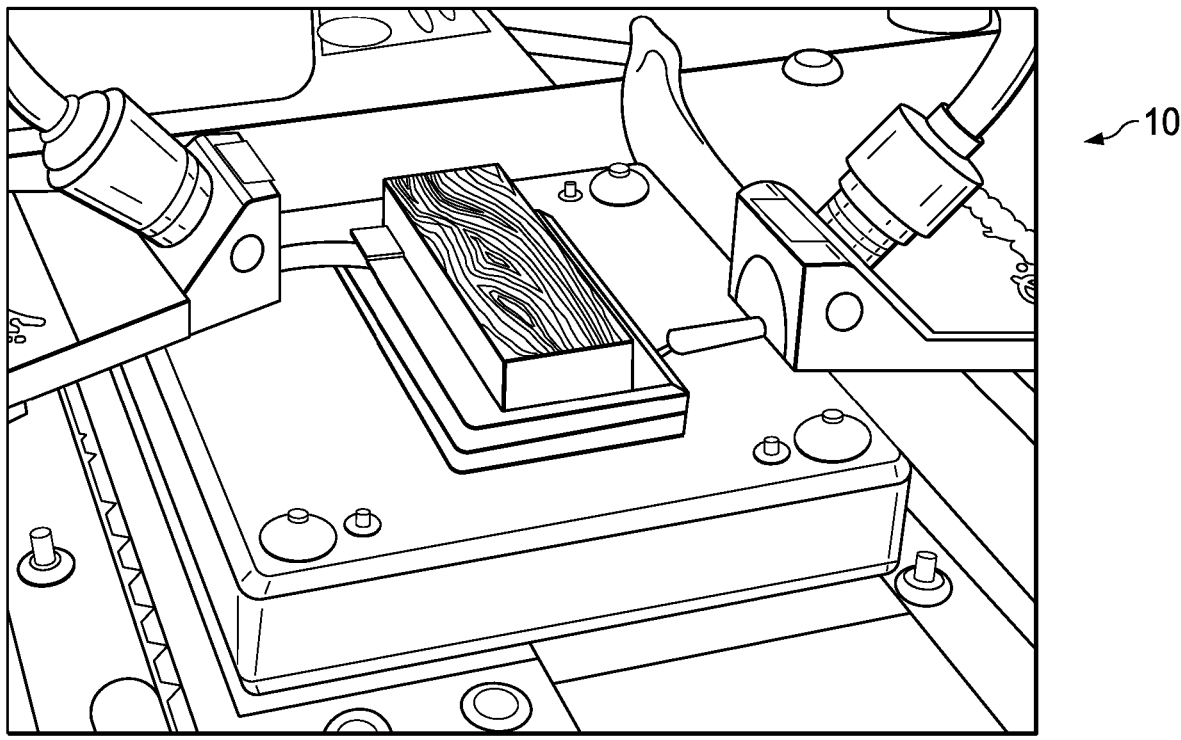
FIG. 1 shows a traditional Empty Waveguide Device using traditional of the prior art.
Figure 2:
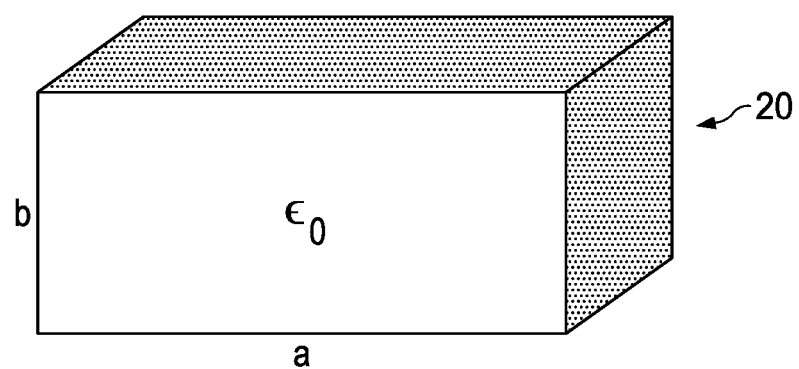
FIG. 2 shows the dimension definition of rectangular Substrate Integrated of the prior art.
Figure 3:
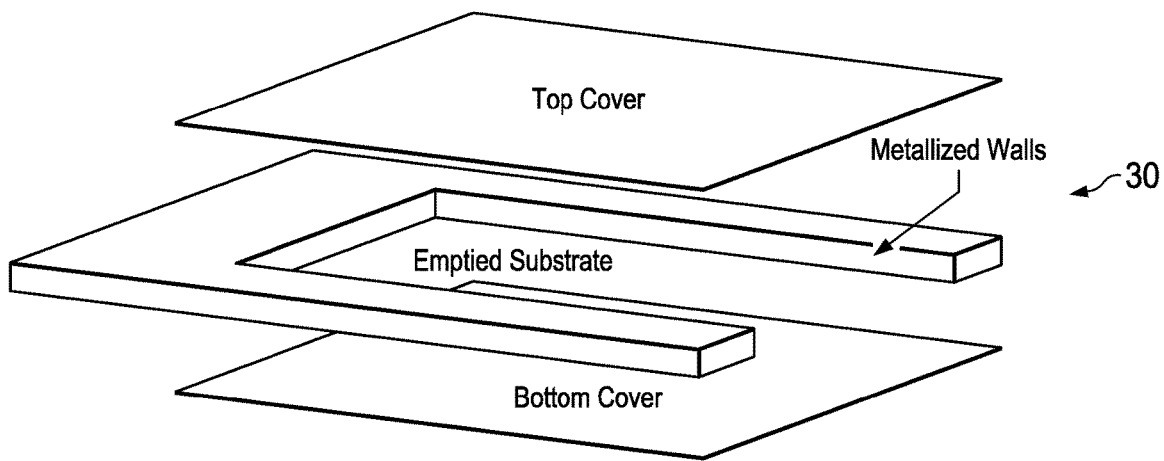
FIG. 3 shows a basic empty surface integrated waveguide structure in a PCB published by Belenguer of the prior art.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The present invention relates in general to the field of glass based empty substrate integrated waveguide devices. More particularly, the present invention relates to the reduction of parasitic capacitance from fringe capacitance in an RF capacitive resonate filter on the same substrate or in a package. In certain aspects, the present invention is a fringe capacitance reduction of a coupled transmission line resonate filters.

Photosensitive glass structures have been suggested for a number of micromachining and microfabrication processes such as integrated electronic elements in conjunction with other elements systems or subsystems. Semiconductor microfabrication using thin film additive processes on semiconductor, insulating or conductive substrates is expensive with low yield and a high variability in performance. An example of additive micro-transmission can be seen in articles Semiconductor Microfabrication Processes by Tian et al., which rely on expensive capital equipment; photolithography and reactive ion etching or ion beam milling tools that generally cost in excess of one million dollars each and require an ultra-clean, high-production silicon fabrication facility costing millions to billions more. This invention provides a cost effective glass ceramic electronic individual device or as an array of passive devices for a uniform response for RF frequencies with low loss, without the need for reactive ion etching or ion beam milling.

The present invention includes a novel method for fabricating a low loss RF empty substrate integrate waveguide (ESIW) structure in APEX Glass structure for use in forming a number of structures with mechanical stabilization and electrical isolation in a photodefinable glass-ceramic. In general, the present invention includes ESIW structure to create in multiple planes of a photodefinable glass-ceramic substrate, such process employing the (a) exposure to excitation energy such that the exposure occurs at various angles by either altering the orientation of the substrate or of the energy source, (b) a bake step and (c) an etch step.

The photosensitive glass substrate can a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$, a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO.

The present invention includes a high Q empty substrate integrated waveguide device and/or system with low loss, and that is mechanically and thermally stabilized in a photodefinable glass ceramic substrate. Generally, the ESIW has a Q greater than 20, 30, 35, 36, 37, 38, 39, or 40. In another aspect, the ESIW has a lower cut-off frequency than a printed circuit board waveguide device at the same frequency. In another aspect, the ESIW has a higher peak power handling capability than a printed circuit ESIW.

The present invention has created the capability to create such fabricating a low loss RF ESIW structure including mechanical support elements in both the vertical as well as horizontal plane for photodefinable glass-ceramic substrate.

General Process.

Step 1. Lap and polish a photodefinable glass ceramic substrate or wafer.

Step 2. The photodefinable glass-ceramic substrate is then exposed to the ESIW pattern, ESIW supports and perimeter ground patterns. The ESIW pattern is the basic pattern of the waveguide defining areas of no glass. The ESIW support elements can be a cylindrical pattern can have a diameter ranging from 5 μm to 150 μm in with but preferably 35 μm in diameter. The perimeter ground pattern is the pattern that defines the edges of the waveguide. Patterns are exposed using approximately 20 J/cm² of 310 nm light for 2 to 20 min exposure.

Step 3. Anneal at temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles.

Step 4. Coat the topside of the wafer with photoresist; expose and develop a pattern to protect the waveguide pattern while leaving the ground pattern exposed.

Step 5. Spin on blanket photoresist on to the backside of the wafer, place the cooled wafer into an HF bath to etch the exposed ground ceramic portions.

Step 6. Using a standard photoresist stripper, remove the photoresist leaving ground pattern openings and ceramic waveguide areas in the wafer.

Step 7. Place the wafer into a copper electroplating bath and plate the open ground pattern with copper until all ground openings are filled.

Step 8. Coat the backside of the wafer with photoresist; expose and develop a rectangular element with small etch release features, this will become the back side of the ESIW.

Step 9. Using a metallization tool such as a sputtering system deposit 200 Å to 2,000 Å of titanium metal, e.g., 300 Å: followed by a 1 μm deposition of copper onto the backside of the wafer.

Step 10. Using a standard photoresist stripper remove the photoresist leaving rectangular copper element for the bottom of the ESIW structure that is electrically connected to the ground pattern copper.

Step 11. Coat the backside of the wafer with photoresist; expose and develop a rectangular element that is oversized of the ceramic ESIW pattern with etch release features.

Step 12. Place the wafer into a copper electroplating bath and plate the exposed copper areas with between 5-50 um of copper in order to improve the rigidity of the ESIW structure.

Step 13. Using a metallization tool such as a sputtering system deposit 200 Å to 2,000 Å of titanium metal, e.g., 300 Å: followed by a 0.5 um to 1 μm deposition of copper onto the topside of the wafer.

Step 14. Coat the top side of the wafer with photoresist; expose and develop the top side ESIW pattern as well as patterns for RF signal launch elements, Phase matching elements, time delay elements, filter elements and antenna elements.

Step 15. Using a standard photoresist stripper, copper etchant and titanium etchant remove the photoresist and etch any exposed deposition metal, leaving the electroplated copper ESIW patterns.

Step 16. The wafer is then placed into a 0.5% to 50% HF in an ultrasonic bath.

Figure 4:
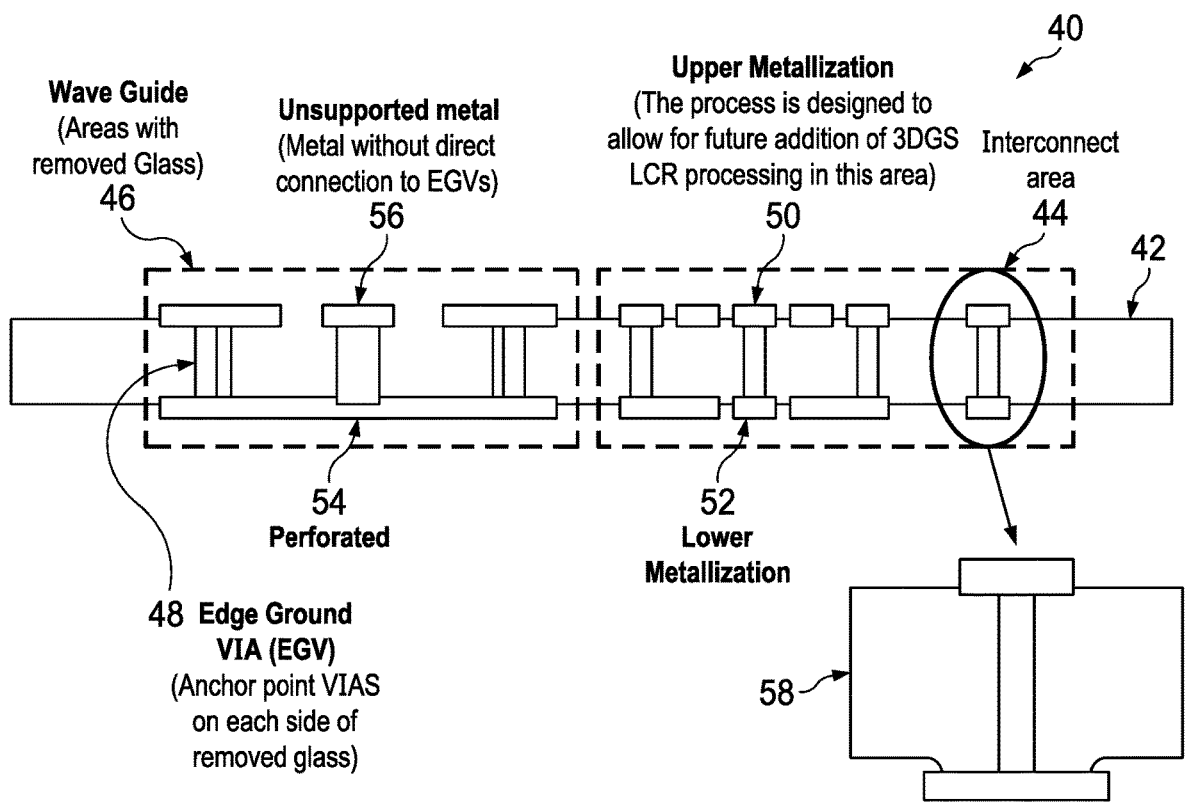
FIG. 4 shows a microstrip line to empty substrate integrate waveguide (ESIW) connection made in a printed circuit board.

Starting with a photodefinable glass substrate or wafer that is between 1 mm and 250 μm thick lap and polish the photodefinable glass substrate to a root mean square (RMS) surface roughness between 200 Å and 10 Å preferably 50 Å. The photodefinable glass-ceramic substrate is then exposed to the ESIW pattern that includes ESIW supports and perimeter ground patterns. The ESIW pattern is the basic rectangular pattern of the waveguide defining areas. The volume of the rectangular pattern can range between 0% to 100% dielectric. Generally, the volume of the rectangular pattern will have no dielectric material. The ESIW support elements can be a cylindrical pattern, hexagonal or other pattern with a diameter ranging from 5 μm to 200 μm but preferably 35 μm in diameter. The perimeter of the rectangular defines the edges of the waveguide and may be electrically connected to ground. The patterns are exposed using approximately 20 J/cm$^2$ of 310 nm light for 2 to 20 min exposure. After exposing the photodefinable glass substrate is annealed at temperature range heated between 420° C.-520° C. for between 10 minutes to 2 hours. This annealing process coalesces the silver ions into silver nanoparticles. The photodefinable glass substrate is the annealed at a temperature range heated between 520° C.-620° C. for between 10 minutes and 2 hours allowing the lithium oxide to migrate and form around the silver nanoparticles. The top side of the photodefinable glass substrate is then coated with photoresist; where a pattern is exposed and developed to protect the waveguide pattern while leaving the ground pattern exposed. The backside photodefinable glass substrate is coated with a blanket photoresist and then into an HF bath to etch the exposed ground ceramic portions are etched. The HF etchant bath can have a concentration between 2% and 20% but often 10% at room temperature. See FIG. 4 shows an empty substrate integrated waveguide 40 of the present invention. Using a standard photoresist stripper remove the photoresist leaving ground pattern openings and ceramic waveguide areas in the wafer. Place the wafer into a copper electroplating bath and plate the open ground pattern with copper until all ground openings are filled. The copper plating can range from 5 μm to 50 μm bit preferably 20 μm thick. The backside of the photodefinable glass substrate is coated with photoresist. A rectangular element is the exposed and developed including small etch release features. This will become the backside of the ESIW. These etch release features can be rectangular, round or square openings between 10-200 um in size, evenly spaced between 0.05 and 1 mm apart covering the entire ESIW ceramic pattern. Using a metallization tool such as a sputtering system or other metallization tool to deposit 200 Å to 2,000 Å of titanium metal, e.g., 300 Å: followed by a between 0.5 μm to 15 μm, e.g., 1 μm of copper onto the backside of the photodefinable glass substrate. Then using a standard photoresist stripper remove the photoresist leaving rectangular copper element for the bottom of the ESIW structure that is electrically connected to the ground pattern copper. Next, coat the backside of the photodefinable glass substrate with photoresist; expose and develop a rectangular element that is oversized by 5-35% but preferably 15% of the ceramic ESIW pattern with etch release features.

The photodefinable glass substrate is placed into a copper electroplating bath and plate the exposed copper areas with between 5-100 μm of copper in order to improve the rigidity of the ESIW structure. Using a metallization tool such as a sputtering system deposit 200 Å to 2,000 Å of titanium metal preferably 300 Å: followed by a 0.5 μm to 5 μm, e.g., 1 μm deposition of copper onto the topside of the photodefinable glass substrate. The photodefinable glass substrate is then coat the topside with photoresist is exposed and developed with the topside ESIW pattern. This pattern includes patterns for RF signal launch elements, Phase matching elements, time delay elements, filter elements and antenna elements. The photodefinable glass substrate is then placed into a copper electroplating bath and plate the exposed copper areas with between 5-100 μm of copper. The photoresist on the photodefinable glass substrate removed using standard photoresist stripper, copper etchant and titanium etchant remove the photoresist and etch any exposed deposition metal, leaving the electroplated copper ESIW patterns. The photodefinable glass substrate is then placed into a 0.5% to 50% HF solution preferably 10%. The etching process can be accelerated by use of an ultrasonic bath. The ultrasonic bath can be operated in the pulse, sweep and fix mode at frequencies from 28 Khz to 200 Khz to release the ESIW structure and remove all of the defined ceramic structures. The photodefinable glass substrate is then placed into a deionized water (DI) rinse bath to stop the etching process substrate. The photodefinable glass substrate rinsed and dried wafer. The photodefinable glass substrate is then translated to a wafer dicing system to release the ESIW device/system. The ESIW device is a simple antenna combined with an RF signal launch elements. A ESIW system includes phase matching elements, time delay elements, filter elements in addition to antenna and RF signal launch elements.

FIG. 4 shows an empty substrate integrated waveguide 40 of the present invention, in which a substrate 42, in this case the photodefinable glass substrate, has been formed into the device. Integrated with the waveguide 40 are an interconnect area 44 and a waveguide area 45. The edge ground via(s) 48 (EGVs), which are anchor point vias on each side of the removed glass, contact the upper metallization 50 and the lower metallization 52. For the upper metallization 50, the process can be designed to allow for additional circuits or features. Also shown are perforated areas 54 in addition to unsupported metal areas 56, which are not in electrical contact with the edge ground vias 48. A close-up view 58, is shown for the through-vias, that also show the option for cutting-in or undercutting the lower metallization area 52.

FIG. 5A shows top view, and FIG. 5B an oblique view, of a RF filter that can be a part of the ESIW system of the present invention. FIG. 6A shows a top view, and FIG. 6B shows an oblique view, of a cavity RF filter that can be a part of the ESIW system of the present invention. FIG. 7A shows a top view, and FIG. 7B an oblique view, of a RF filter coupler that can be a part of the ESIW system of the present invention. Each of the top and oblique views of 5A to 7B can be used to form the device shown in FIG. 4.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

It will be understood by those of skill in the art that information and signals may be represented using any of a variety of different technologies and techniques (e.g., data, instructions, commands, information, signals, bits, symbols, and chips may be represented by voltages, currents, electromagnetic waves, magnetic fields or particles, optical fields or particles, or any combination thereof). Likewise, the various illustrative logical blocks, modules, circuits, and algorithm steps described herein may be implemented as electronic hardware, computer software, or combinations of both, depending on the application and functionality. Moreover, the various logical blocks, modules, and circuits described herein may be implemented or performed with a general purpose processor (e.g., microprocessor, conventional processor, controller, microcontroller, state machine or combination of computing devices), a digital signal processor ("DSP"), an application specific integrated circuit ("ASIC"), a field programmable gate array ("FPGA") or other programmable logic device, discrete gate or transistor logic, discrete hardware components, or any combination thereof designed to perform the functions described herein. Similarly, steps of a method or process described herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art.

All of the systems, devices, computer programs, compositions and/or methods disclosed and claimed herein can be made and executed without undue experimentation in light of the present disclosure. While the systems, devices, computer programs, compositions and methods of this invention have been described in terms of preferred embodiments, it will be apparent to those of skill in the art that variations may be applied to the systems, devices, computer programs, compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method of making an empty substrate integrated waveguide (ESIW) device including antenna and RF signal launch elements comprising the steps of:
   forming an ESIW pattern, an ESIW supports RF signal launch, a perimeter ground patterns and one or more edges of a waveguide on a wafer comprising lithium ions;
   annealing the exposed pattern in the presence of silver ions at a temperature that enables silver ions to coalesce into silver nanoparticles, and increasing the temperature to between 520° C.-620° C. to allow lithium oxide to form around the silver nanoparticles;
   coating a topside of the wafer with a photoresist; exposing and developing a pattern to protect the waveguide pattern while leaving the ground pattern exposed;
   spinning on a blanket photoresist on a backside of the wafer and etching exposed ground ceramic portions in an HF bath;
   removing the photoresist leaving one or more ground pattern openings and a ceramic waveguide;
   electroplating copper on the open ground pattern until all ground openings are filled;
   coating a backside of the wafer with photoresist; exposing and developing a rectangular element with one or more small etch release features;
   depositing 200 Å to 2,000 Å of titanium metal to form a first titanium layer, followed by a 1 μm deposition of copper onto the backside of the wafer;
   removing the photoresist leaving a rectangular copper element to form a bottom of the ESIW structure that is electrically connected to the ground pattern copper and waveguide launching element;
   exposing and developing a rectangular element in photoresist that is oversized over the ceramic ESIW pattern with the one or more etch release features;
   electroplating copper on the exposed copper areas with between 5-50 μm of copper to improve the rigidity of the ESIW structure;
   depositing 200 Å to 2,000 Å of titanium metal to form a second titanium layer followed by a 0.5 um to 1 μm deposition of copper onto the topside of the wafer;
   coating the top side of the wafer with a photoresist; exposing and developing a top side ESIW pattern;
   using a standard photoresist stripper, copper etchant and titanium etchant to remove the photoresist and to etch any exposed deposition metal, leaving the electroplated copper ESIW patterns;
   placing wafer in a 0.5% to 50% HF ultrasonic bath; and
   washing the wafer to remove the HF to obtain the empty substrate integrated waveguide device including antenna and RF signal launch elements.

2. The method of claim 1, wherein the ESIW has a Q greater than 40.

3. The method of claim 1, wherein the ESIW has a lower cut-off frequency than a printed circuit board waveguide device at the same frequency.

4. The method of claim 1, wherein the ESIW has a higher peak power handling capability than a printed circuit board waveguide device at the same frequency.

5. The method of claim 1, wherein the first, the second, or both first and second titanium layers have a thickness of 300 Å.

6. A method of creating an empty substrate integrated waveguide system including at least one or more of a phase matching, time delay, crossover or filter elements, connected to an antenna and RF signal launch element, comprising:
   a. exposing to an ESIW pattern, an ESIW support, RF signal launch, perimeter ground patterns, and the edges of a waveguide;
   b. annealing the exposed pattern temperature enabling the coalesces silver ions into silver nanoparticles;
   c. annealing the exposed pattern temperature range heated between 520° C.-620° C. for allowing the lithium oxide to form around the silver nanoparticles;
   d. coating a topside of the wafer with a photoresist and exposing and developing a pattern to protect the waveguide pattern while leaving the ground pattern exposed;
   e. spinning on blanket photoresist on to the backside of the wafer and HF bath to etch the exposed ground ceramic portions;
   f. removing the photoresist to leave ground pattern openings and ceramic waveguide;
   g. electroplating copper on the open ground pattern until all ground openings are filled;
   h. coating a backside of the wafer with photoresist; and exposing and developing a rectangular element with one or more small etch release features;

i. depositing 200 Å to 2,000 Å of titanium metal to form a first titanium layer followed by a 1 μm deposition of copper onto the backside of the wafer;

j. removing the photoresist to leave a rectangular copper element for the bottom of the ESIW structure that is electrically connected to the ground pattern copper and waveguide launching element;

k. exposing and developing a rectangular element in photoresist that is oversized of the ceramic ESIW pattern with one or more etch release features;

l. Electroplating copper on the exposed copper areas with between 5-50 um of copper in order to improve the rigidity of the ESIW structure;

m. depositing 200 Å to 2,000 Å of titanium metal to form a second titanium layer followed by a 0.5 um to 1 μm deposition of copper onto the topside of the wafer;

n. coating the top side of the wafer with photoresist; exposing and developing a top side ESIW pattern and patterns for the RF signal launch elements and the antenna elements, and at least one the Phase matching elements, the time delay elements, or the filter elements and;

o. using a standard photoresist stripper, copper etchant and titanium etchant to remove the photoresist and to etch any exposed deposition metal, leaving an electroplated copper ESIW patterns;

p. placing the wafer into a 0.5% to 50% HF in an ultrasonic bath; and q. washing the wafer to remove the HF.

7. The method of claim 6, wherein the ESIW has a Q greater than 40.

8. The method of claim 6, wherein the ESIW has a lower cut-off frequency than a printed circuit board waveguide device at the same frequency.

9. The method of claim 6, wherein the ESIW has higher peak power handling capability than an ESIW.

10. The method of claim 6, wherein the first, the second, or both first and second titanium layers have a thickness of 300 Å.

* * * * *